(12) United States Patent
Ooshima

(10) Patent No.: US 9,653,303 B2
(45) Date of Patent: May 16, 2017

(54) METHOD OF MANUFACTURING SEMICONDUCTOR DEVICE

(71) Applicant: KABUSHIKI KAISHA TOSHIBA, Minato-ku (JP)

(72) Inventor: Kazuhiro Ooshima, Kuwana (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/927,767

(22) Filed: Oct. 30, 2015

(65) Prior Publication Data

US 2017/0053807 A1 Feb. 23, 2017

Related U.S. Application Data

(60) Provisional application No. 62/206,614, filed on Aug. 18, 2015.

(51) Int. Cl.
| | | |
|---|---|---|
| *H01L 27/115* | (2017.01) | |
| *H01L 21/28* | (2006.01) | |
| *H01L 21/3065* | (2006.01) | |
| *H01L 21/3105* | (2006.01) | |

(52) U.S. Cl.
CPC .... *H01L 21/28273* (2013.01); *H01L 21/3065* (2013.01); *H01L 21/3105* (2013.01)

(58) Field of Classification Search
CPC .......... H01L 21/28273; H01L 21/3065; H01L 21/3105; H01L 27/11582; H01L 27/11556
See application file for complete search history.

(56) References Cited

U.S. PATENT DOCUMENTS

| | | | |
|---|---|---|---|
| 2011/0244666 A1* | 10/2011 | Kim | ................ H01L 27/11551 438/478 |
| 2012/0061743 A1 | 3/2012 | Watanabe et al. | |
| 2014/0021628 A1* | 1/2014 | Shih | ................ H01L 21/76805 257/774 |
| 2014/0175534 A1 | 6/2014 | Kofuji et al. | |

FOREIGN PATENT DOCUMENTS

JP 3108929 11/2000

* cited by examiner

*Primary Examiner* — Peter Bradford
(74) *Attorney, Agent, or Firm* — Oblon, McClelland, Maier & Neustadt, L.L.P.

(57) ABSTRACT

In one embodiment, a method of manufacturing a semiconductor device includes forming a structure in which first to N-th insulating layers and first to N-th metal layers are alternately provided on a substrate where N is an integer of two or more. The method further includes processing the first insulating layer. The method further includes forming a first film on a side face of the first insulating layer, the first film containing a first reaction product generated by processing the first insulating layer. The method further includes processing the first metal layer under the first insulating layer, and the second insulating layer under the first metal layer by using the first film as a mask.

16 Claims, 10 Drawing Sheets

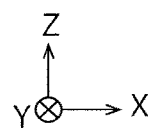
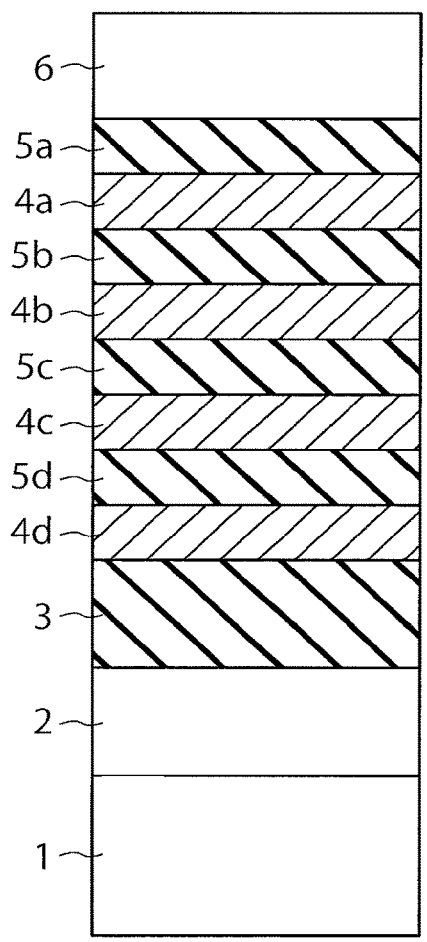
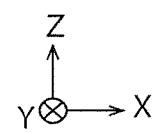
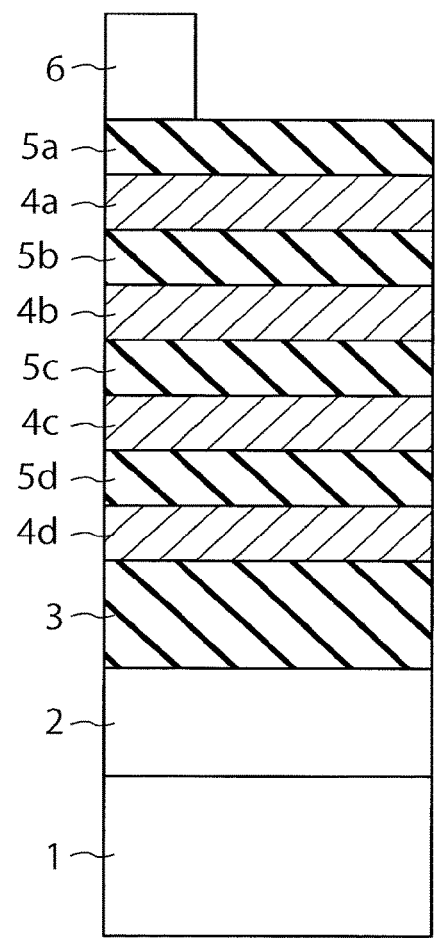
FIG. 1A
FIG. 1B

METHOD OF MANUFACTURING SEMICONDUCTOR DEVICE

CROSS REFERENCE TO RELATED APPLICATION

This application is based upon and claims the benefit of priority from the prior U.S. Provisional Patent Application No. 62/206,614 filed on Aug. 18, 2015, the entire contents of which are incorporated herein by reference.

FIELD

Embodiments described herein relate to a method of manufacturing a semiconductor device.

BACKGROUND

When a three-dimensional memory is manufactured, a contact region having a stair shape is formed by forming a structure in which insulating layers and metal layers are alternately provided on a substrate and processing these layers by alternately executing lithography and dry etching. In this case, it is necessary to repeatedly move the substrate between an exposure apparatus for the lithography and a dry etching apparatus for the dry etching. Therefore, many worker-hours are required to form the contact region, which increases manufacturing cost of the three-dimensional memory. Such a problem may occur in manufacturing a semiconductor device other than the three-dimensional memory by executing the lithography and the dry etching.

BRIEF DESCRIPTION OF THE DRAWINGS

FIGS. 1A to 6B are sectional views illustrating a method of manufacturing a semiconductor device of a first embodiment;

DETAILED DESCRIPTION

Figure 2A:
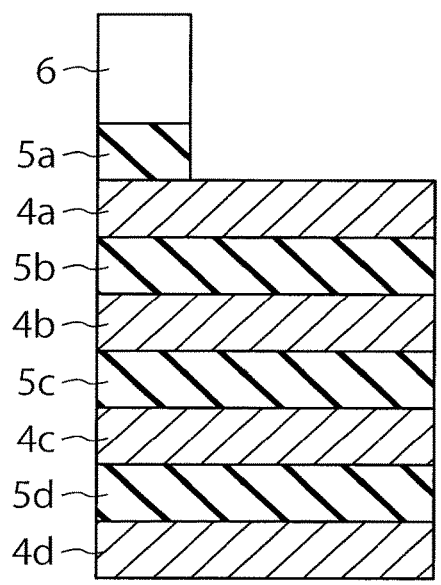

Embodiments will now be explained with reference to the accompanying drawings.

In one embodiment, a method of manufacturing a semiconductor device includes forming a structure in which first to N-th insulating layers and first to N-th metal layers are alternately provided on a substrate where N is an integer of two or more. The method further includes processing the first insulating layer. The method further includes forming a first film on a side face of the first insulating layer, the first film containing a first reaction product generated by processing the first insulating layer. The method further includes processing the first metal layer under the first insulating layer, and the second insulating layer under the first metal layer by using the first film as a mask.

First Embodiment

FIGS. 1A to 6B are sectional views illustrating a method of manufacturing a semiconductor device of a first embodiment. In the method of the present embodiment, a contact region of a three-dimensional memory is formed on a substrate 1.

First, a ground layer 2 and an insulator 3 are formed on the substrate 1 (FIG. 1A). Next, a structure in which metal layers 4a to 4d and insulating layers 5a to 5d are alternately stacked is formed on the insulator 3 (FIG. 1A). This structure may be formed by alternately forming the metal layers 4a to 4d and the insulating layers 5a to 5d on the insulator 3, or may be formed by alternately forming sacrificial layers and the insulating layers 5a to 5d on the insulator 3 and replacing these sacrificial layers with the metal layers 4a to 4d. A resist layer 6 is then formed on the structure (FIG. 1A). A hard mask layer may be used in place of the resist layer 6.

An example of the substrate 1 includes a semiconductor substrate such as a silicon substrate. FIG. 1A illustrates an X direction and a Y direction that are parallel to a surface of the substrate 1 and are perpendicular to each other, and a Z direction perpendicular to the surface of the substrate 1. In the present specification, +Z direction is treated as an up direction, and −Z direction is treated as a down direction. The −Z direction of the present embodiment may be matched with a gravity direction, or may not be matched with the gravity direction.

Examples of the ground layer 2 include a gate insulator, a gate electrode, a contact plug, an interconnect layer and an inter layer dielectric. An example of the insulator 3 includes an inter layer dielectric. In the present embodiment, illustration of the substrate 1, the ground layer 2 and the insulator 3 is omitted in the drawings after FIGS. 1A and 1B.

An example of each of the metal layers 4a to 4d includes an elemental metal layer such as a tungsten (W) layer, an aluminum (Al) layer or a copper (Cu) layer. An example of each of the insulating layers 5a to 5d includes a silicon-containing insulator such as a silicon nitride film (SiN) or a silicon oxide film ($SiO_2$). In the present embodiment, the metal layers 4a to 4d are W layers, and the insulating layers 5a to 5d are SiN layers.

Hereinafter, the metal layers 4a to 4d are respectively called first to fourth metal layers 4a to 4d, and the insulating layers 5a to 5d are respectively called first to fourth insulating layers 5a to 5d. The first to fourth metal layers 4a to 4d are examples of first to N-th metal layers, and the first to fourth insulating layers 5a to 5d are examples of first to N-th insulating layers, where N is an integer of two or more. N may be a value other than four.

Next, the resist layer 6 is processed by lithography and etching (FIG. 1B). As a result, the resist layer 6 is patterned in a predetermined shape.

Next, the first insulating layer 5a is processed by using the resist layer 6 as a mask (FIG. 2A). The first insulating layer 5a of the present embodiment is processed by dry etching using a first gas. An example of this dry etching is reactive ion etching (RIE).

The first gas contains carbon, and further contains fluorine and/or hydrogen. Examples of the first gas include a $CH_2F_2$ gas, a $CHF_3$ gas, a $C_4F_6$ gas and a $C_4F_8$ gas where C represents carbon, F represents fluorine and H represents hydrogen. Composition ratios of fluorine in these gases are respectively 2/5, 3/5, 6/10 and 8/12, which are smaller than a composition ratio of fluorine in a $CF_4$ gas (i.e., 8/10). Such a first gas has an advantage that it can selectively etch the first insulating layer 5a selected from the first insulating layer 5a and the first metal layer 4a. By using such a first gas, the first insulating layer 5a can be etched such that a selection ratio of the first insulating layer 5a to the first metal layer 4a is five or more (preferably, ten or more).

Figure 2B:
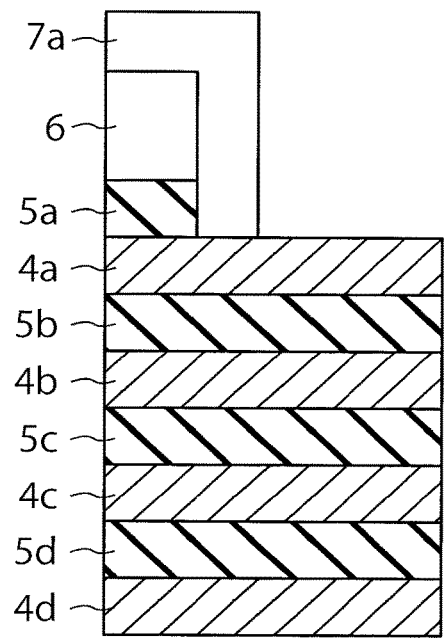

The first insulating layer 5a is etched by a chemical reaction of a substance that forms the first insulating layer 5a (i.e., SiN) and the first gas. In this case, carbon is generated as a reaction product of the chemical reaction, and a carbon film 7a is formed to contain this carbon (FIG. 2B). This reaction product is an example of a first reaction product, and the carbon film 7a is an example of a first film. The carbon film 7a is formed on a side face of the first insulating layer 5a, and a side face and an upper face of the resist layer 6. In the present embodiment, adhesion of the carbon film 7a to an upper face of the first metal layer 4a can be suppressed by decreasing effective power between electrodes of a RIE apparatus. The thickness of the carbon film 7a can be controlled by adjusting etching time of the first insulating layer 5a.

Figure 3A:
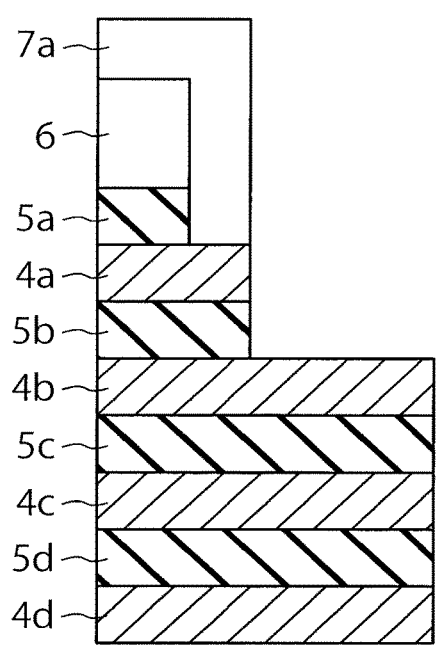

Next, the first metal layer 4a under the first insulating layer 5a is processed by using the carbon film 7a as a mask (FIG. 3A). The first metal layer 4a of the present embodiment is processed by dry etching using a second gas that is different from the first gas. An example of this dry etching is RIE.

The second gas contains carbon, and further contains fluorine and/or hydrogen. An example of the second gas includes a $CF_4$ gas. Therefore, in the present embodiment, the composition ratio of fluorine in the first gas is smaller than the composition ratio of fluorine in the second gas. By using the $CF_4$ gas as the second gas in the present embodiment, the second gas can selectively etch the first metal layer 4a selected from the first metal layer 4a and the second insulating layer 5b.

More specifically, the first metal layer 4a of the present embodiment is processed by using the second gas and an oxygen gas. Therefore, carbon generated from the $CF_4$ gas reacts with this oxygen, and is changed into carbon dioxide.

Next, the second insulating layer 5b under the first metal layer 4a is processed by using the carbon film 7a as a mask (FIG. 3A). The second insulating layer 5b of the present embodiment is processed by RIE using the first gas, similarly to the first insulating layer 5a. The second insulating layer 5b is an example of a second insulating layer, and is an example of a K-th insulator (K is an integer from 2 to N−1) in a case of K=2. Examples of the first gas include a $CH_2F_2$ gas, a $CHF_3$ gas, a $C_4F_6$ gas and a $C_4F_8$ gas.

Figure 3B:
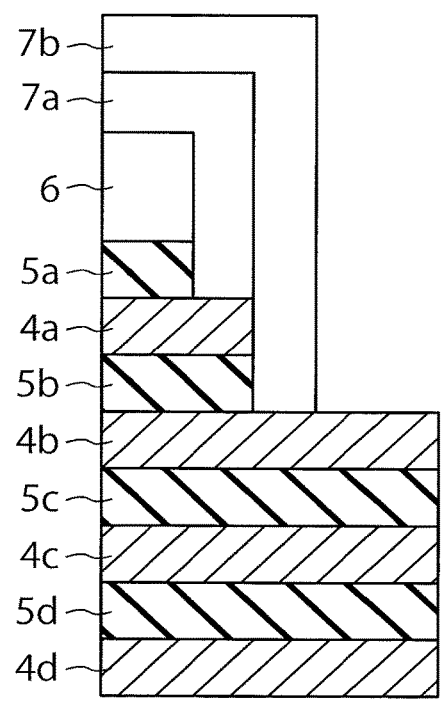

The second insulating layer 5b is etched by a chemical reaction of a substance that forms the second insulating layer 5b (i.e., SiN) and the first gas. In this case, carbon is generated as a reaction product of the chemical reaction, and a carbon film 7b is formed to contain this carbon (FIG. 3B). This reaction product is an example of a K-th reaction product (K=2), and the carbon film 7b is an example of a K-th film (K=2). The carbon film 7b is formed on a side face of the second insulating layer 5b, a side face of the first metal layer 4a, and a side face and an upper face of the carbon film 7a. In the present embodiment, adhesion of the carbon film 7b to an upper face of the second metal layer 4b can be suppressed by decreasing the effective power between the electrodes of the RIE apparatus. The thickness of the carbon film 7b can be controlled by adjusting etching time of the second insulating layer 5b.

Figure 4A:
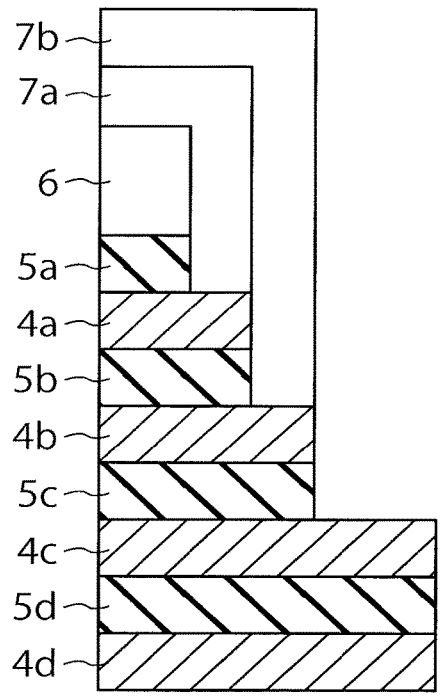

Next, the second metal layer 4b under the second insulating layer 5b is processed by using the carbon film 7b as a mask (FIG. 4A). The second metal layer 4b of the present embodiment is processed by RIE using the second gas, similarly to the first metal layer 4a. The second metal layer 4b is an example of a K-th metal film in the case of K=2. An example of the second gas includes a $CF_4$ gas.

More specifically, the second metal layer 4b of the present embodiment is processed by using the second gas and an oxygen gas. Therefore, carbon generated from the $CF_4$ gas reacts with this oxygen, and is changed into carbon dioxide.

Figure 4B:
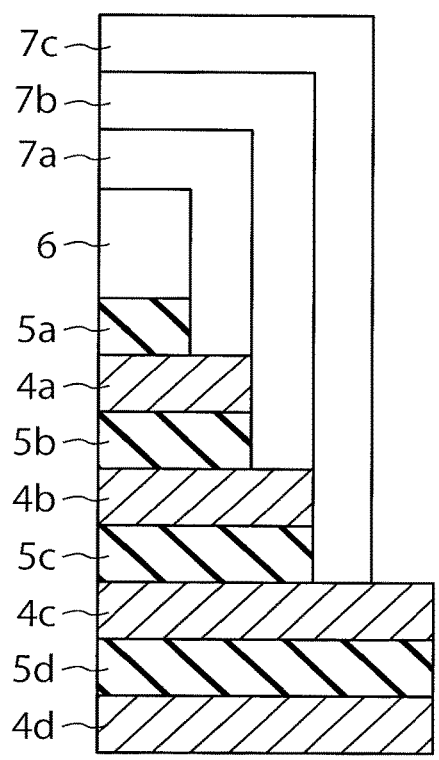
Figure 5A:
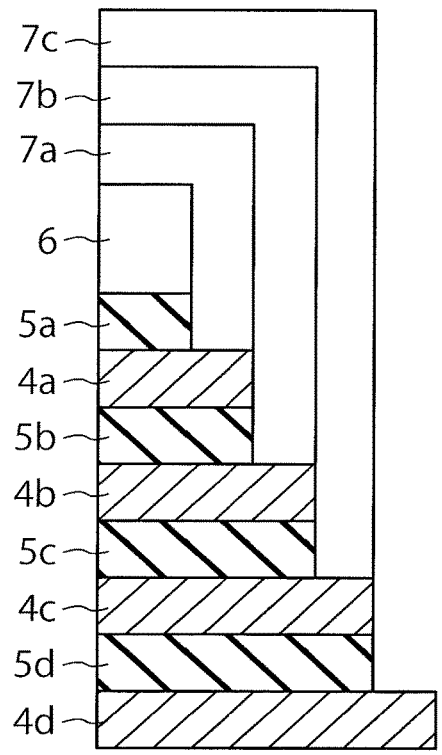
Figure 5B:
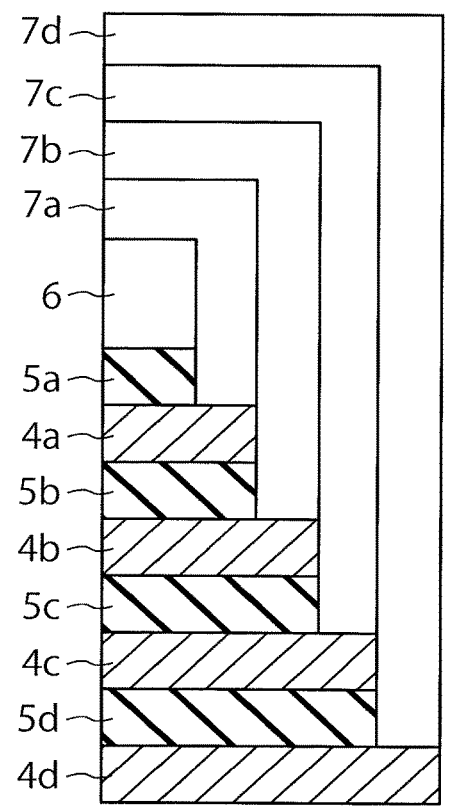

Thereafter, processing of the third and fourth insulating layers 5c and 5d and the third metal layer 4c is executed similarly to the processing of the second insulating layer 5b and the second metal layer 4b. The third insulating layer 5c is processed with the first gas by using the carbon film 7b as a mask (FIG. 4A), and thereby a carbon film 7c is formed (FIG. 4B). The third metal layer 4c is processed with the second gas by using the carbon film 7c as a mask (FIG. 5A). The fourth insulating layer 5d is processed with the first gas by using the carbon film 7c as a mask (FIG. 5A), and thereby a carbon film 7d is formed (FIG. 5B). The carbon films 7a to 7d are then removed (FIG. 6A).

Figure 6A:
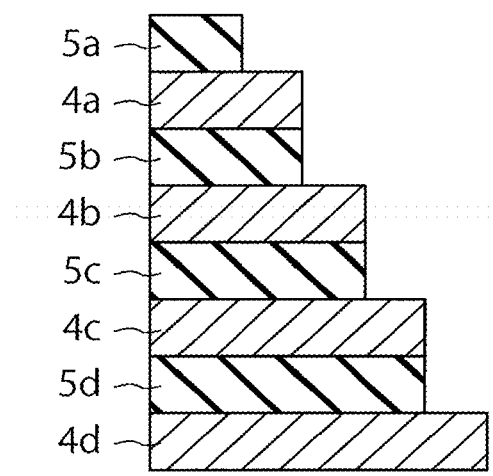

In this way, the contact region having a stair shape is formed of the first to fourth insulating layers 5a to 5d and the first to fourth metal layers 4a to 4d (FIG. 6A). In FIG. 6A, upper faces of the first to fourth metal layers 4a to 4d are respectively exposed from the first to fourth insulating layers 5a to 5d.

Figure 6B:
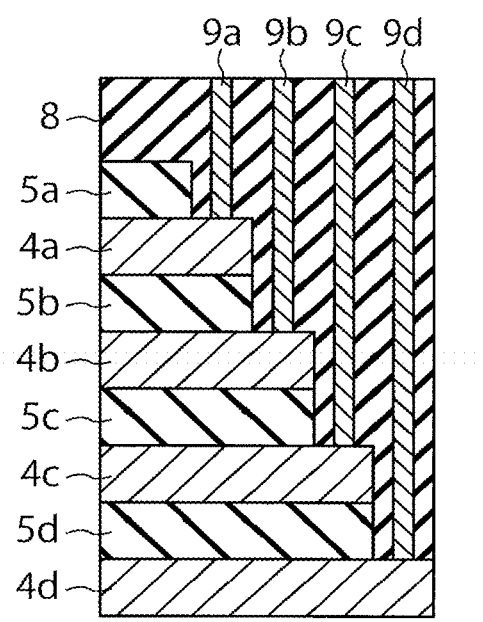

Next, an inter layer dielectric 8 is formed on the contact region (FIG. 6A). Contact holes reaching the upper faces of the first to fourth metal layers 4a to 4d are then formed in the inter layer dielectric 8, and a plug material is embedded in the contact holes. As a result, first to fourth contact plugs 9a to 9d are respectively formed on the upper faces of the first to fourth metal layers 4a to 4d (FIG. 6B).

Thereafter, various interconnect layers and inter layer dielectrics are formed on the substrate 1. In this way, the semiconductor device of the present embodiment is manufactured.

Figure 7:
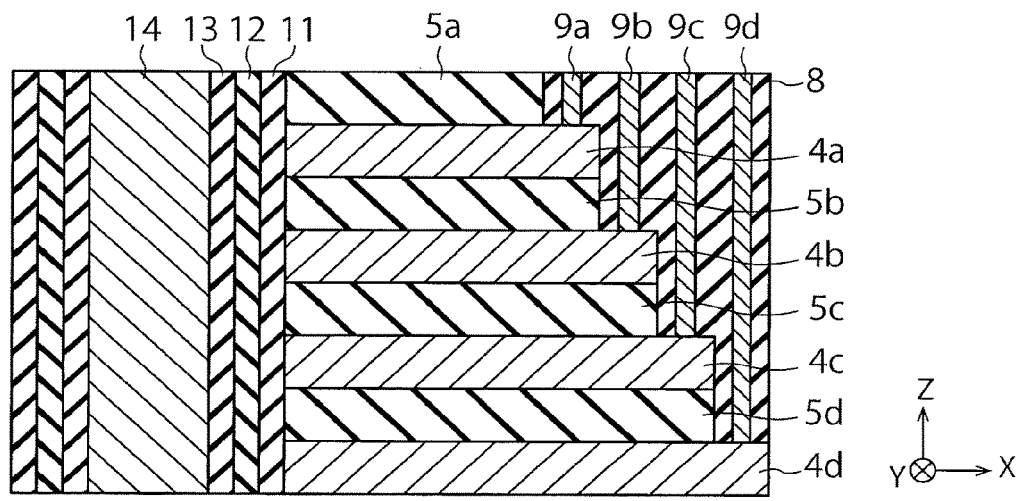
FIG. 7 is a sectional view illustrating an example of a structure of the semiconductor device of the first embodiment.

FIG. 7 is a sectional view illustrating an example of a structure of the semiconductor device of the first embodiment.

FIG. 7 illustrates a first insulator 11, a charge storage layer 12, a second insulator 13 and a channel semiconductor layer 14 that form the three-dimensional memory. Examples of the first insulator 11, the charge storage layer 12, the second insulator 13 and the channel semiconductor layer 14 are a silicon oxide film, a silicon nitride film, a silicon oxide film, and a polysilicon layer, respectively. The charge storage layer 12 has a function to store signal charges of the three-dimensional memory. Shapes of the first insulator 11, the charge storage layer 12 and the second insulator 13 in FIG. 7 are circular pipe shapes extending in the Z direction. A shape of the channel semiconductor layer 14 in FIG. 7 is a circular cylinder shape extending in the Z direction. The first to fourth metal layers 4a to 4d and the first to fourth insulating layers 5a to 5d face the channel semiconductor layer 14 through the first insulator 11, the charge storage layer 12 and the second insulator 13.

Figure 8:
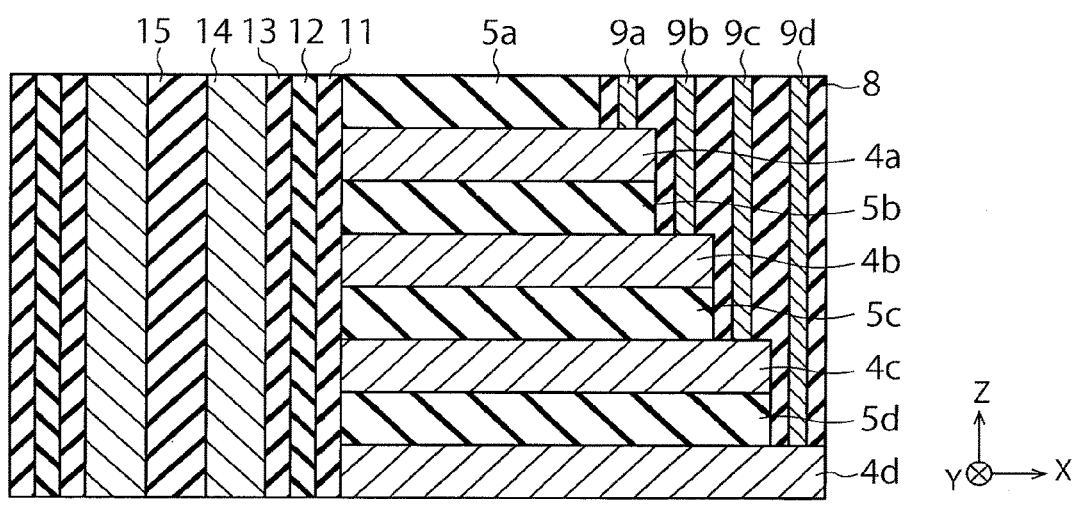
FIG. 8 is a sectional view illustrating another example of the structure of the semiconductor device of the first embodiment.

FIG. 8 is a sectional view illustrating another example of the structure of the semiconductor device of the first embodiment.

FIG. 8 further illustrates a third insulator 15 that forms the three-dimensional memory. An example of the third insulator 15 is a silicon oxide film. The shapes of the first insulator 11, the charge storage layer 12, the second insulator 13 and the channel semiconductor layer 14 in FIG. 8 are circular pipe shapes extending in the Z direction. A shape of the third insulator 15 in FIG. 8 is a circular cylinder shape extending in the Z direction and is surrounded by the channel semiconductor layer 14.

The stair shape of the present embodiment can be applied to a semiconductor device other than the three-dimensional memory. An example of such a semiconductor device is a resistive random access memory (ReRAM).

Figure 9:
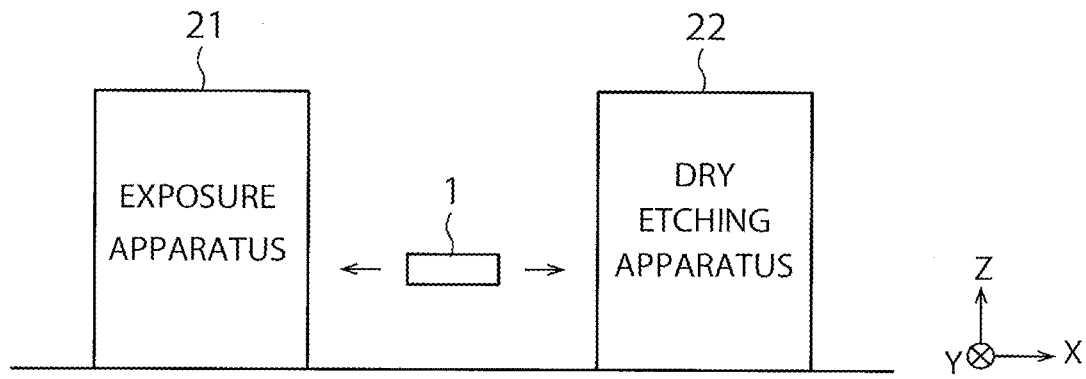
FIG. 9 is a diagram for describing an advantage of the method of manufacturing the semiconductor device of the first embodiment.

FIG. 9 is a diagram for describing an advantage of the method of manufacturing the semiconductor device of the first embodiment.

FIG. 9 illustrates an exposure apparatus 21 and a dry etching apparatus 22 used in the method of the present embodiment. The exposure apparatus 21 is used in lithography of the resist layer 6 in the process of FIG. 1B. The dry etching apparatus 22 is used in the processing from the first to fourth insulating layers 5a to 5d and the first to third metal layers 4a to 4c in the processes of FIGS. 2A to 5B. In this case, the carbon films 7a to 7d are also formed in the dry etching apparatus 22.

In general, when the contact region having the stair shape is formed, the substrate 1 is repeatedly moved between the exposure apparatus 21 and the dry etching apparatus 22. Therefore, many worker-hours are required to form the contact region, which increases manufacturing cost of the three-dimensional memory.

Meanwhile, the processes of FIGS. 2A to 5B in the present embodiment can be executed in the same dry etching apparatus 22, and therefore the substrate 1 is not moved from the dry etching apparatus 22 to the exposure apparatus 21 during the processes. Therefore, the present embodiment makes it possible to easily form the contact region with a few worker-hours and to decrease the manufacturing cost of the three-dimensional memory. Furthermore, the present embodiment makes it possible, by using the carbon films 7a to 7d formed in processing the first to fourth insulating layers 5a to 5d as masks, to decrease the worker-hours for forming the masks.

Figure 10:
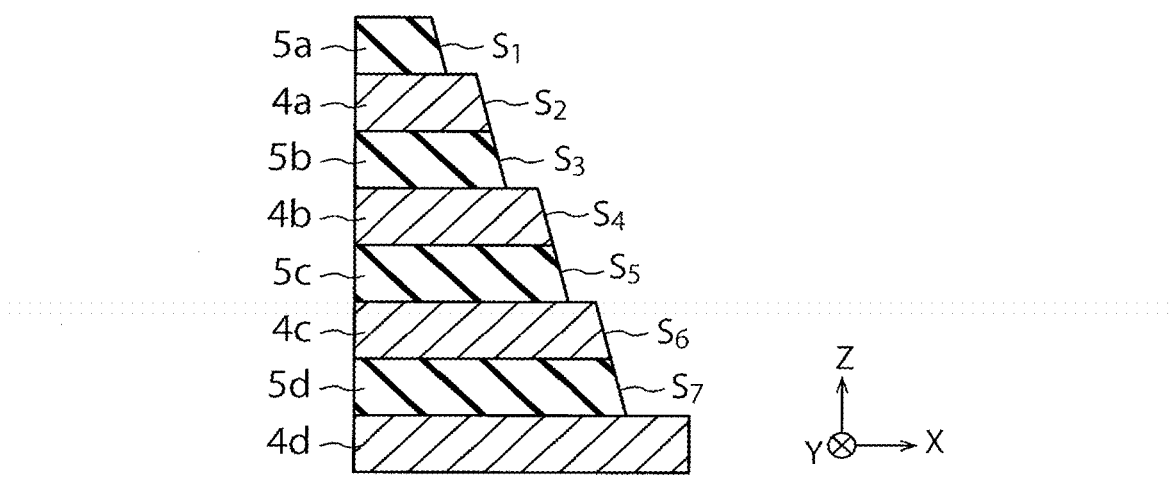
FIG. 10 is a sectional view illustrating details of the structure of the semiconductor device of the first embodiment.

FIG. 10 is a sectional view illustrating details of the structure of the semiconductor device of the first embodiment.

FIG. 10 illustrates the contact region of FIG. 5A in detail. The reference signs $S_1$ to $S_7$ indicate side faces of the first to fourth insulating layers 5a to 5d and the first to third metal layers 4a to 4c. In the processes of FIGS. 2A to 5B of the present embodiment, the first to fourth insulating layers 5a to 5d and the first to third metal layers 4a to 4c are processed such that these side faces $S_1$ to $S_7$ have tapered shapes. However, angles of inclination of these side faces $S_1$ to $S_7$ to the Z direction are slight angles in many cases.

As described above, the present embodiment forms the carbon films 7a to 7d containing the reaction product generated by processing the insulating layers 5a to 5d, on the side faces of the insulating layers 5a to 5d, and processes the metal layers 4a to 4c and the insulating layers 5b to 5d by using the carbon films 7a to 7d as the masks. Therefore, the present embodiment makes it possible to easily form the contact region having the stair shape.

Second Embodiment

FIGS. 11A to 11D are sectional views illustrating a method of manufacturing a semiconductor device of a second embodiment.

Figure 11D:
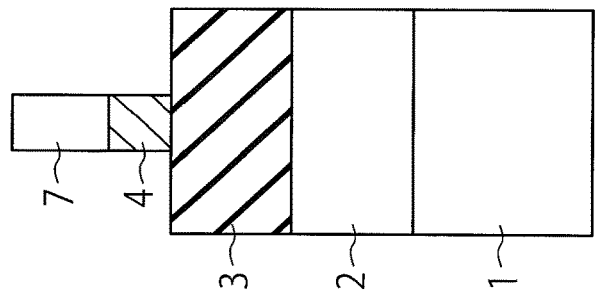
FIGS. 11A to 11D are sectional views illustrating a method of manufacturing a semiconductor device of a second embodiment.
Figure 11C:
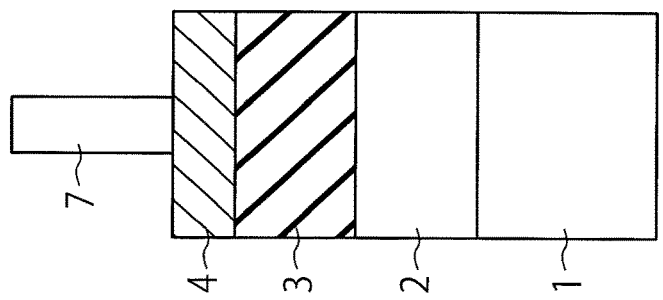
Figure 11B:
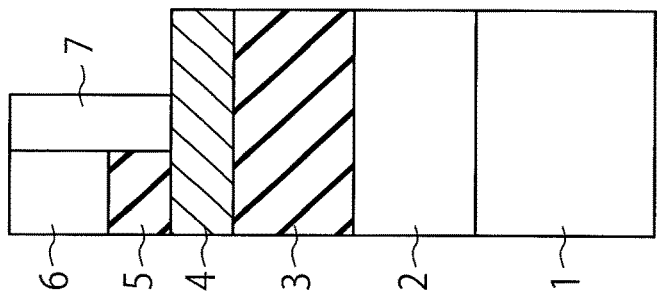
Figure 11A:
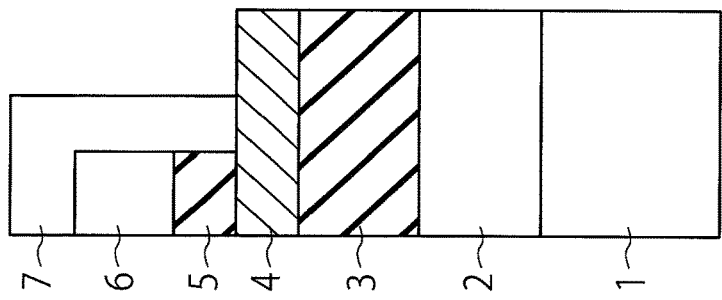

First, a ground layer 2, an insulator 3, a metal layer 4, an insulating layer 5 and a resist layer 6 are formed on a substrate 1, similarly to the process of FIG. 1A (FIG. 11A). Examples of the metal layer 4 are similar to those of the metal layers 4a to 4d of the first embodiment. Examples of the insulating layer 5 are similar to those of the insulating layers 5a to 5d of the first embodiment.

Next, the resist layer 6 is processed similarly to the process of FIG. 1B, and the insulating layer 5 is processed similarly to the process of FIG. 2A (FIG. 11A). As a result, a carbon film 7 is formed on a side face of the insulating layer 5 and a side face and an upper face of the resist layer 6, similarly to the carbon film 7a of FIG. 2B (FIG. 11A). The metal layer 4, the insulating layer 5 and the carbon film 7 are examples of a first layer, a second layer and a first film, respectively.

Next, the carbon film 7 is removed from the upper face of the resist layer 6 (FIG. 11B). The resist layer 6 and the insulating layer 5 are then removed (FIG. 11C). In this way, a sidewall pattern of the carbon film 7 is formed on the metal layer 4.

Next, the metal layer 4 is processed by using the carbon film 7 as a mask (FIG. 11D). For example, the metal layer 4 is processed by RIE using a second gas.

As described above, the present embodiment can process the carbon film 7 into the sidewall pattern, and can process the metal layer 4 by using the sidewall pattern as a mask. The sidewall pattern of the present embodiment may be used for processing the first layer made of only the metal layer 4, or may be used for processing the first layer including the metal layer 4 and another layer.

Third Embodiment

Figure 12A:
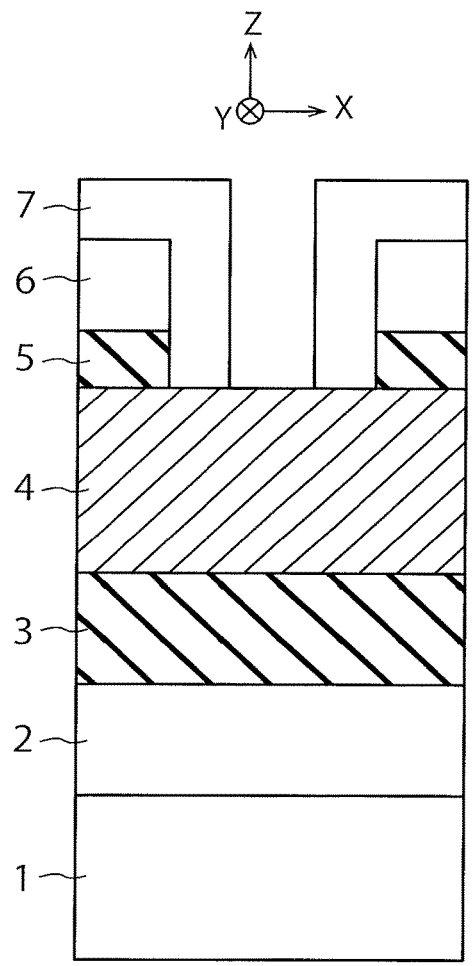
FIGS. 12A and 12B are sectional views illustrating a method of manufacturing a semiconductor device of a third embodiment.
Figure 12B:
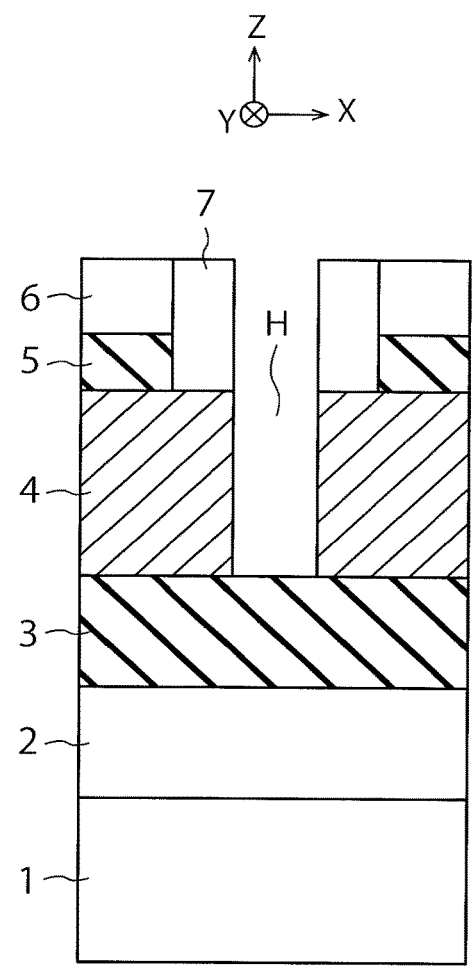

FIGS. 12A and 12B are sectional views illustrating a method of manufacturing a semiconductor device of a third embodiment.

First, a ground layer 2, an insulator 3, a metal layer 4, an insulating layer 5 and a resist layer 6 are formed on a substrate 1, similarly to the process of FIG. 1A (FIG. 12A). Examples of the metal layer 4 are similar to those of the metal layers 4a to 4d of the first embodiment. Examples of the insulating layer 5 are similar to those of the insulating layers 5a to 5d of the first embodiment. In the present embodiment, the thickness of the metal layer 4 is set thicker than the thickness of the insulating layer 5.

Next, the resist layer 6 is processed similarly to the process of FIG. 1B, and the insulating layer 5 is processed similarly to the process of FIG. 2A (FIG. 12A). As a result, a carbon film 7 is formed on a side face of the insulating layer 5, and a side face and an upper face of the resist layer 6, similarly to the carbon film 7a of FIG. 2B (FIG. 12A). The metal layer 4, the insulating layer 5 and the carbon film 7 are examples of a first layer, a second layer and a first film, respectively.

Next, the metal layer 4 is processed by using the carbon film 7 as a mask (FIG. 12B). For example, the metal layer 4 is processed by RIE using a second gas. In this case, since the metal layer 4 of the present embodiment is thick, the carbon film 7 is removed during the RIE, so that the resist layer 6 is exposed. Therefore, the metal layer 4 is processed by using the carbon film 7 and the resist layer 6 as a mask.

In the present embodiment, when the insulating layer 5 is processed by the processing of FIG. 12A, carbon is generated as a reaction product. This carbon does not only form the carbon film 7, but also enters the resist layer 6. As a result, strength of the resist layer 6 is improved. Therefore, the present embodiment makes it possible to form a deep hole H in the metal layer 4 by using the resist layer 6 as a mask (FIG. 12B).

As described above, the present embodiment can process the thick metal layer 4 by using the resist layer 6 as a mask. The resist layer 6 of the present embodiment may be used for processing the first layer made of only the metal layer 4, or may be used for processing the first layer including the metal layer 4 and another layer.

While certain embodiments have been described, these embodiments have been presented by way of example only, and are not intended to limit the scope of the inventions. Indeed, the novel methods described herein may be embodied in a variety of other forms; furthermore, various omissions, substitutions and changes in the form of the methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, comprising:
forming a structure in which first to N-th insulating layers and first to N-th metal layers are alternately provided on a substrate where N is an integer of two or more;
processing the first insulating layer;
forming a first film on a side face of the first insulating layer, the first film containing a first reaction product generated by processing the first insulating layer; and
processing the first metal layer under the first insulating layer, and the second insulating layer under the first metal layer by using the first film as a mask,
wherein
the first reaction product is generated by a chemical reaction of a substance that forms the first insulating layer, and a first gas used when the first insulating layer is processed; and
the first film is formed in a dry etching apparatus by controlling effective power between electrodes of the dry etching apparatus and selecting the first gas to suppress adhesion of the first film to an upper face of the first metal film.

2. The method of claim 1, further comprising:
forming a K-th film on a side face of a K-th insulating layer, the K-th film containing a K-th reaction product generated by processing the K-th insulating layer where K is an integer from 2 to N−1; and
processing a K-th metal layer under the K-th insulating layer, and a (K+1)-th insulating layer under the K-th metal layer by using the K-th film as a mask,
wherein
the K-th reaction product is generated by a chemical reaction of a substance that forms the K-th insulating layer, and a first gas used when the K-th insulating layer is processed; and
the K-th film is formed in a dry etching apparatus by controlling effective power between electrodes of the dry etching apparatus and selecting the first gas to suppress adhesion of the K-th film to an upper face of the first metal film.

3. The method of claim 1, wherein the first gas contains carbon.

4. The method of claim 1, wherein the first gas contains fluorine or hydrogen.

5. The method of claim 1, wherein the first gas is a $CH_2F_2$ gas, a $CHF_3$ gas, a $C_4F_6$ gas or a $C_4F_8$ gas where C represents carbon, F represents fluorine and H represents hydrogen.

6. The method of claim 1, wherein the first metal layer is processed by using a second gas different from the first gas.

7. The method of claim 6, wherein the second gas contains carbon.

8. The method of claim 6, wherein the second gas contains fluorine or hydrogen.

9. The method of claim 6, wherein the second gas is a $CF_4$ gas where C represents carbon and F represents fluorine.

10. The method of claim 6, wherein a composition ratio of fluorine in the first gas is smaller than a composition ratio of fluorine in the second gas.

11. The method of claim 2, wherein the K-th metal layer is processed by using a second gas different from the first gas.

12. The method of claim 2, further comprising exposing upper faces of the first to N-th metal layers from the first to N-th insulating layers by processing the first to N-th insulating layers, respectively, and forming first to N-th plugs on the upper faces of the first to N-th metal layers, respectively.

13. The method of claim 1, wherein the first to N-th metal layers face a semiconductor layer through a first insulator, a charge storage layer and a second insulator.

14. The method of claim 1, wherein the processing of the first insulating layer, the formation of the first film, and the processing of the first metal layer and the second insulating layer are executed in a same dry etching apparatus.

15. The method of claim 1, wherein the first insulating layer is processed such that the side face of the first insulating layer is tapered.

16. The method of claim 1, wherein the first insulating layer is etched such that a selection ratio of the first insulating layer to the first metal layer is five or more.

* * * * *